United States Patent
Nakayama

[11] Patent Number: 5,856,685
[45] Date of Patent: Jan. 5, 1999

[54] HETEROJUNCTION FIELD EFFECT TRANSISTOR

[75] Inventor: Tatsuo Nakayama, Tokyo, Japan

[73] Assignee: NEC Corporation, Tokyo, Japan

[21] Appl. No.: 604,249

[22] Filed: Feb. 21, 1996

[30] Foreign Application Priority Data

Feb. 22, 1995 [JP] Japan .................................... 7-058041
Feb. 28, 1995 [JP] Japan .................................... 7-039502

[51] Int. Cl.$^6$ ................................................ H01L 31/0328
[52] U.S. Cl. ........................ 257/192; 257/201; 257/615; 257/22
[58] Field of Search ................................ 257/192, 194, 257/201, 280, 613, 615, 22

[56] References Cited

U.S. PATENT DOCUMENTS 5,404,032  4/1995  Sawada et al. ......................... 257/615
5,449,928  9/1995  Matsugatani et al. .................. 257/615

FOREIGN PATENT DOCUMENTS 63-278277  11/1988  Japan .
2-199875   8/1990   Japan ..................................... 257/615

*Primary Examiner*—Mark V. Prenty
*Attorney, Agent, or Firm*—Sughrue, Mion, Zinn, Macpeak & Seas, PLLC

[57] ABSTRACT

A heterojunction field effect transistor having an InP substrate, comprising a buffer layer formed between an active layer where a carrier travels and said InP substrate, wherein said buffer layer has at least two cycles of superlattices, each of said superlattices being formed of at least one semiconductor selected from the group consisting of $Al_xIn_{1-x}P$ ($0.1 \leq x \leq 1$), $Ga_xIn_{1-x}P$ ($0 \leq x \leq 1$), $Al_xGa_{1-x}As$ ($0 \leq x \leq 1$), and $Al_xIn_{1-x}As$ ($0.5 \leq x \leq 1$), and at least one semiconductor selected from the group consisting of InP and $In_{0.52}Al_{0.48}As$.

23 Claims, 6 Drawing Sheets

FIG. IA
PRIOR ART
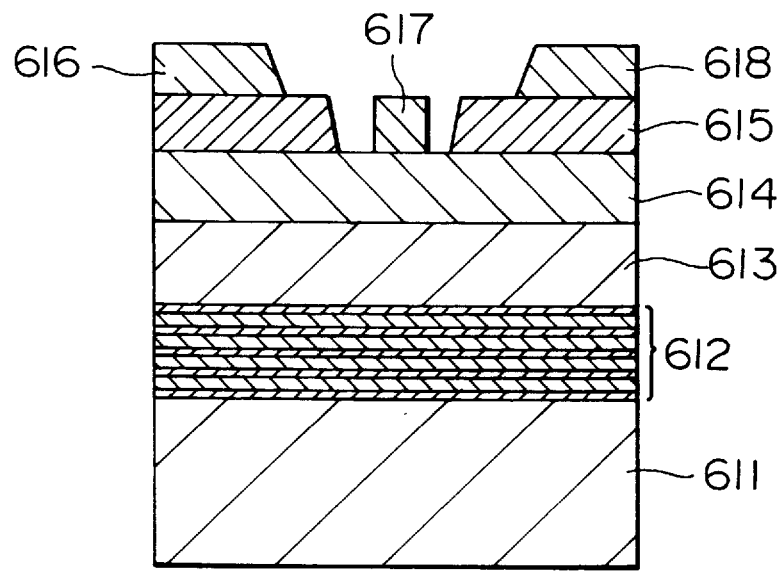
FIG. IB
PRIOR ART
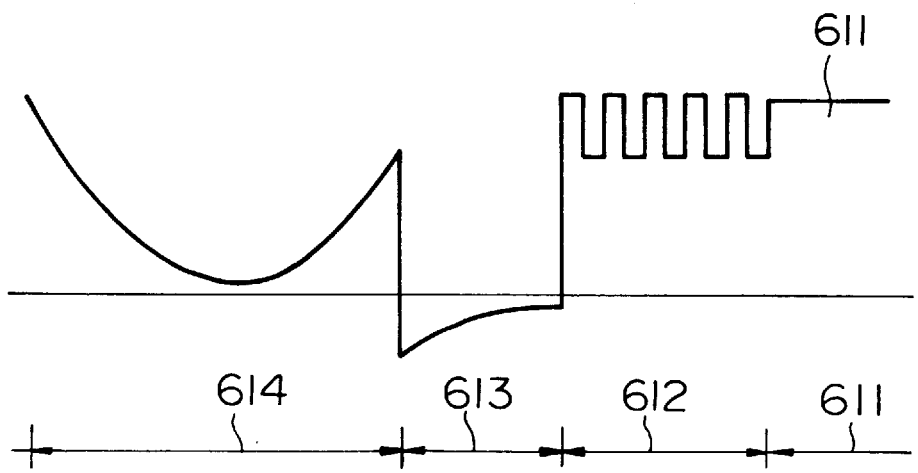

HETEROJUNCTION FIELD EFFECT TRANSISTOR

BACKGROUND OF THE INVENTION

1. Field of the Invention

The present invention relates to a heterojunction field effect transistor having an InP substrate.

2. Description of the Prior Art

Conventionally, in a heterojunction field effect transistor having an InP substrate, a structure is disclosed in, e.g., Japanese Unexamined Patent Publication No. 63-278277 issued on Nov. 15, 1988, which uses an InAlAs/InGaAs superlattice as the buffer layer, in order to prevent two-dimensional electron gas generation at an interface between a buffer layer and an active layer which occurs when only an InAlAs layer lattice-matched with an InP substrate is used as the buffer layer, and to prevent two-dimensional electron gas generation in an InGaAs layer in a superlattice which occurs when an InAlAs/InAlGaAs superlattice lattice-matched with an InP substrate is used as the buffer layer.

FIG. 1A shows the sectional structure of a field effect transistor disclosed in this official gazette, and FIG. 1B shows an energy band diagram indicating a change in conduction band of the field effect transistor.

Referring to FIG. 1A, reference numeral 611 denotes an InP substrate; 612, an InAlAs/InAlGaAs superlattice; 613, an InGaAs active layer; 614, an n-InAlAs electron supply layer; 615, an n-InGaAs contact layer; 616, a source electrode; 617, a gate electrode; and 618, a drain electrode.

In the structure shown in FIG. 1A, when compared to a structure using only an InAlAs layer which is lattice-matched with an InP substrate as the buffer layer, an impurity serving as a heavy donor is trapped in the heterointerface of the InAlAs/InAlGaAs superlattice 612 lattice-matched with the InP substrate 611. Thus, two-dimensional electron gas generation at the interface between the InGaAs active layer 613 and the InAlAs/InAlGaAs superlattice 612 serving as the buffer layer is suppressed.

When compared to a structure using an InAlAs/InGaAs superlattice lattice-matched with an InP substrate as the buffer layer, the InAlGaAs layer has a larger band gap than the InGaAs layer. Thus, two-dimensional electron gas generation in the InAlGaAs layer in the superlattice is decreased.

In the above conventional structure, however, when the GaAs composition ratio of the InAlGaAs layer is less than 0.87, as a difference in composition is small between the AlInAs layer and the InAlGaAs layer, the effect of suppressing propagation of dislocations present in the InP substrate to the active layer, diffusion of an impurity, e.g., Fe, doped in increase the resistance of the InP substrate, and the like is small. Thus, the crystallinity of the active layer is degraded, leading to a low transconductance of the transistor.

The AlInAs layer is of an n type of about $1 \times 10^{15}/cm^3$. In the conventional structure, when the GaAs composition ratio of the InAlGaAs layer is higher than 0.87 molar fraction, the band gap of the InAlGaAs layer becomes smaller than that of the InP substrate. If the film thickness of the AlInAs/InAlGaAs superlattice buffer layer is set to a value sufficient for eliminating propagation of the dislocations present in the InP substrate to the active layer, diffusion of the impurity, e.g., Fe, doped in increase the resistance of the InP substrate, and the like, electrons are generated in the AlInAs/InAlGaAs superlattice buffer layer. Then, an electron conduction path is formed in addition to the active layer, leading to a degradation in the pinch-off characteristics of the transistor.

SUMMARY OF THE INVENTION

The present invention has been made in view of the above situations in order to eliminate the above inconveniences of the prior art technique, and has as its object to provide a heterojunction field effect transistor having a good pinch-off characteristics, in which propagation of dislocations present in the InP substrate to the active layer is suppressed, an adverse influence of an impurity, e.g., Fe, doped in increase the resistance of the InP substrate is eliminated, and an electron conduction path is not formed in the buffer layer while a high transconductance is maintained.

In order to achieve the above object, according to the first aspect of the present invention, there is provided a heterojunction field effect transistor having an InP substrate, comprising a buffer layer formed between an active layer where a carrier travels and the InP substrate, wherein the buffer layer has at least two cycles of superlattices, each of the superlattices being formed of at least one semiconductor selected from the group consisting of $Al_xIn_{1-x}P$ ($0.1 \leq x \leq 1$), $Ga_xIn_{1-x}P$ ($0 \leq x \leq 1$), $Al_xGa_{1-x}As$ ($0 \leq x \leq 1$), and $Al_xIn_{1-x}As$ ($0.5 \leq x \leq 1$), and at least one semiconductor selected from the group consisting of InP and $In_{0.52}Al_{0.48}As$.

According to the second aspect of the present invention, there is provided a heterojunction field effect transistor having an InP substrate, comprising a buffer layer formed between an active layer where a carrier travels and the InP substrate, wherein the buffer layer is constituted by at least one layer selected from the group consisting of an $Al_xIn_{1-x}P$ ($0.1 \leq x \leq 1$) layer, a $Ga_xIn_{1-x}P$ ($0 \leq x \leq 1$) layer, an $Al_xGa_{1-x}As$ ($0 \leq x \leq 1$) layer, and an $Al_xIn_{1-x}As$ ($0.5 \leq x \leq 1$) layer, and an InP layer.

According to the third aspect of the present invention, there is provided a heterojunction field effect transistor having an InP substrate, comprising a buffer layer formed between an active layer where a carrier travels and the InP substrate, wherein the buffer layer is constituted by at least one layer selected from the group consisting of an $Al_xIn_{1-x}P$ ($0.1 \leq x \leq 1$) layer, a $Ga_xIn_{1-x}P$ ($0 \leq x \leq 1$) layer, an $Al_xGa_{1-x}As$ ($0 \leq x \leq 1$) layer, and an $Al_xIn_{1-x}As$ ($0.5 \leq x \leq 1$) layer, and an $In_{0.52}Al_{0.48}As$ layer.

According to the fourth aspect of the present invention, there is provided a heterojunction field effect transistor obtained by sequentially forming a superlattice consisting of at least two cycles of $In_{0.52}Al_{0.48}As$ layers and InP layers, a GaInAs active layer, an AlInAs spacer layer, an AlInAs carrier supply layer, and an AlInAs Schottky layer on an InP substrate, and arranging a source electrode, a drain electrode, and a gate electrode on a resultant structure.

In addition to the above aspects, the present invention also has auxiliary aspects as follows.

The AlP composition ratio of the AlInP layer according to any one of the first to third aspects preferably falls within a range of 0.2 to 0.5 molar fraction.

The GaP composition ratio of the GaInP layer according to any one of the first to third aspects preferably falls within a range of 0.2 to 0.5 molar fraction.

The AlAs composition ratio of the AlGaAs layer according to any one of the first to third aspects is preferably 0.3 molar fraction.

The AlAs composition ratio of the AlInAs layer according to any one of the first to third aspects preferably falls within a range of 0.55 to 0.8 molar fraction.

The buffer layer according to any one of the first to fourth aspects has a total thickness falling within a range of 50 nm to 400 nm.

The material constituting the active layer according to any one of the first to third aspects is a material selected from the group consisting of GaInAs, InP, GaInAsP, InSb, and InGaSb.

The GaAs composition ratio of the active layer falls within a range of 0 to 1 molar fraction.

The AlAs composition ratio of each of the spacer layer, the carrier supply layer, and the Schottky layer according to the fourth aspect falls within a range of 0.48 to 1.0 molar fraction.

In the present invention, as the buffer layer is constituted by a material having a band gap equal to or larger than that of the InP substrate, storage of electrons in the buffer layer caused by the fact that the AlInAs layer is of an n type of about $1 \times 10^{15}/cm^3$ is suppressed. As the composition ratios of the two layers constituting the heterointerface are largely different from each other, or the two layers are made of different materials, and the two layers constituting the heterointerface have different lattice constants, a distortion is caused. Therefore, propagation of dislocation present in the InP substrate to the active layer, and diffusion of an impurity, e.g., Fe, added in order to increase the resistance of the InP substrate, are suppressed in the heterointerface. As a result, an active layer having a high crystallinity can be obtained, and the buffer layer can be made thin. An electron conduction path will not be formed in the buffer layer. Accordingly, an FET fabricated by the present invention can achieve good pinch-off characteristics without decreasing the transconductance.

The above and many other advantages, features and additional objects of the present invention will become manifest to those versed in the art upon making reference to the following detailed description and accompanying drawings in which preferred embodiments incorporating the principles of the present invention are shown by way of illustrated example.

BRIEF DESCRIPTION OF THE DRAWINGS

FIG. 1A is a sectional view showing the structure of a conventional heterojunction field effect transistor, and FIG. 1B is an energy band diagram indicating a change in conduction band of the conventional field effect transistor;

DETAILED DESCRIPTION OF PREFERRED EMBODIMENTS

Several preferred embodiments of the present invention will be described with reference to the accompanying drawings.

Figure 2A:
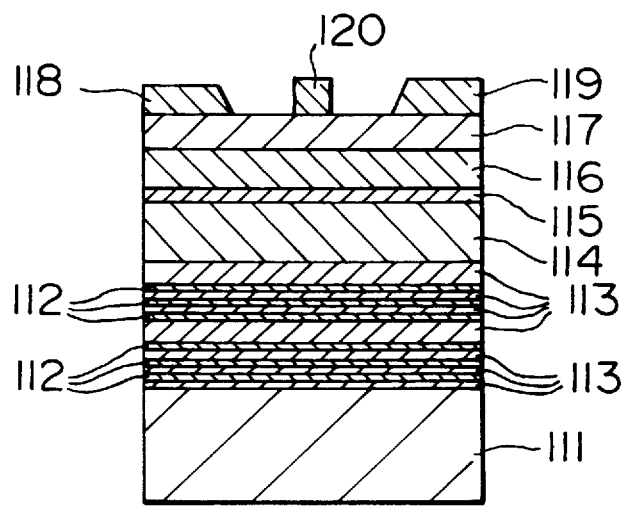
FIG. 2A is a sectional view showing the structure of the first embodiment of the present invention.
Figure 2B:
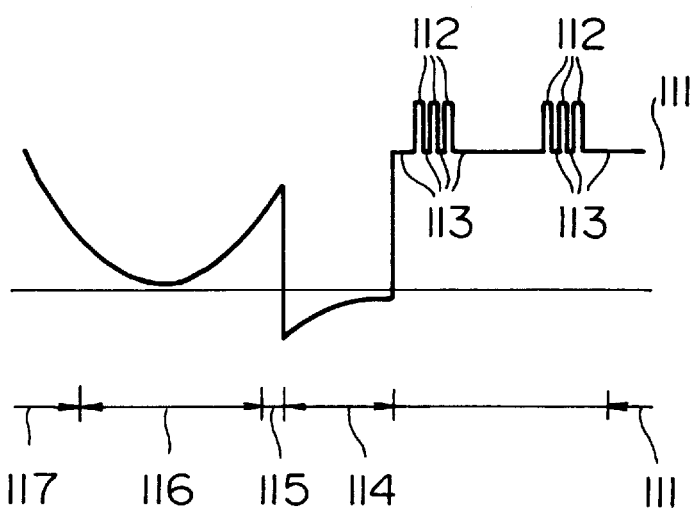
FIG. 2B is an energy band diagram indicating a change in conduction band of the first embodiment.

FIGS. 2A and 2B show the first embodiment of the present invention.

FIG. 2A is a sectional view showing the structure of the first embodiment of the present invention, and FIG. 2B is an energy band diagram indicating a change in conduction band of the structure shown in FIG. 2A.

A field effect transistor shown in FIG. 2A is fabricated by forming, on an InP substrate 111, InP layers 113 (e.g., with a film thickness of 200 nm), including AlInP layers 112 (e.g., with an AlP composition ratio of 0.3 molar fraction and a film thickness of 2 nm) at regions separated from the InP substrate 111 by, e.g., 10 nm, 20 nm, 30 nm, 160 nm, 170 nm, and 180 nm, then forming a GaInAs active layer 114 (e.g., with a GaAs composition ratio of 0.47 molar fraction (herein-after this is omitted) and a film thickness of 45 nm), an AlInAs spacer layer 115 (e.g., with an AlAs composition ratio of 0.48 and a film thickness of 4 nm), an AlInAs carrier supply layer 116 (e.g., with an AlAs composition ratio of 0.48 and a film thickness of 15 nm), and an AlInAs Schottky layer 117 (e.g., with an AlAs composition ratio of 0.48 and a film thickness of 15 nm) on the resultant structure, and arranging ohmic electrodes (a source electrode 118 and a drain electrode 119) and a Schottky electrode (a gate electrode 120) on the AlInAs Schottky layer 117.

Note that Si of, e.g., $3 \times 10^{18}$ cm$^{-3}$ is doped in the AlInAs carrier supply layer 116. In this manner, when the InP layers 113 are used as the buffer layer, and the AlInP layers 112 with the AlP composition ratio of 0.3, which are made of a material different from that of the InP layers 113 and which have a larger band gap (energy gap) than that of the InP layers 113 and a lattice constant different from that of the InP layers 113, thus serving as a distortion layer, are interposed in the InP layers 113, propagation of dislocations present in the InP substrate 111 to the GaInAs active layer 114 can be suppressed, the buffer layer thickness can be made as small as 200 nm, and an electron conduction path is not formed in the buffer layer, thereby obtaining a transistor having good pinch-off characteristics.

In the first embodiment, as the buffer layer, one consisting of the InP layers 113 and the AlInP layers 112 interposed in the InP layers 113 and having an AlP composition ratio of 0.3 is used. However, the AlP composition ratio of the AlInP layers 112 can be changed within the range of 0.1 to 1.

As the AlP composition ratio is increased from 0.1, the film thickness (critical thickness) with which the AlInP layers 112 can be formed with a good crystallinity is decreased. Hence, the AlP composition ratio is preferably 0.2 or more and 0.5 or less.

Furthermore, the AlInP layers 112 having an AlP composition ratio of 0.3 can be replaced by either Al$_x$In$_{1-x}$As ($0.5 \leq x \leq 1$) layers, Al$_x$Ga$_{1-x}$As ($0 \leq x \leq 1$) layers, or Ga$_x$In$_{1-x}$P ($0.1 \leq x \leq 1$) layers, or can be replaced by two or more types of layers selected from Al$_x$In$_{1-x}$P ($0.1 \leq x \leq 1$) layers, Al$_x$In$_{1-x}$As ($0.5 \leq x \leq 1$) layers, Al$_x$Ga$_{1-x}$As ($0 \leq x \leq 1$) layers, and Ga$_x$In$_{1-x}$P ($0.1 \leq x \leq 1$) layers.

In the first embodiment, the InP layers 113 and the AlInP layers 112 having an AlP composition ratio of 0.3, both constituting the buffer layer, have film thicknesses of 200 nm and 2 nm, respectively. However, it suffices if, in particular, the AlInP layers having an AlP composition ratio of 0.3 and serving as the distortion layer has a film thickness equal to the critical thickness or less.

If the film thickness of the entire buffer layer exceeds 400 nm, electrons are accumulated in the buffer layer to likely form a conduction path; if less than 50 nm, propagation of dislocations present in the InP substrate 111 to the active layer and diffusion of an impurity, e.g., Fe, in the InP substrate 111 may not be eliminated completely. Hence, the total thickness of the buffer layer is preferably within the range of 50 nm to 400 nm.

In the first embodiment, to form the buffer layer, the AlInP layers 112 are inserted in the InP layers 113 three (three cycles) in each of the InP substrate 111 side and the active layer 114 side. However, it suffices if at least one AlInP layer 112 is inserted in either the InP substrate 111 side or the active layer 114 side. Furthermore, although the active layer 114 is formed of a GaInAs layer and its GaAs composition ratio is set to 0.47, the GaAs composition ratio can be changed from 0 to 1.

The material to form the active layer 114 may be InP, GaInAs, GaInAsP, InSb, or InGaSb. Regarding the AlAs composition ratio of each of the AlInAs spacer layer 115, the AlInAs carrier supply layer 116, and the AlInAs Schottky layer 117, it can be changed from 0.48 to 1.

The doping concentration can be a desired value. Regarding the dopant, in the first embodiment, as the electrons are employed as the carrier, Si is used as an n-type dopant. However, any other dopant, e.g., S or Se, can be used as far as it serves as an n-type dopant. In a heterojunction field effect transistor that uses holes as the carrier, a p-type dopant, e.g., Be or C, can be used.

Figure 3A:
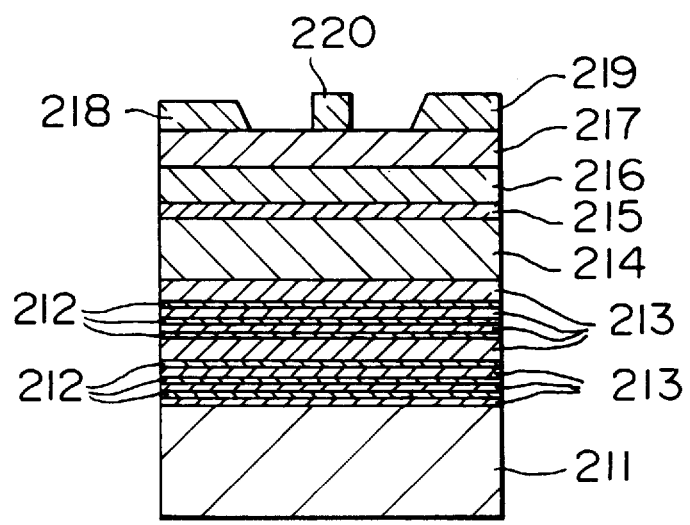
FIG. 3A is a sectional view showing the structure of the second embodiment of the present invention.
Figure 3B:
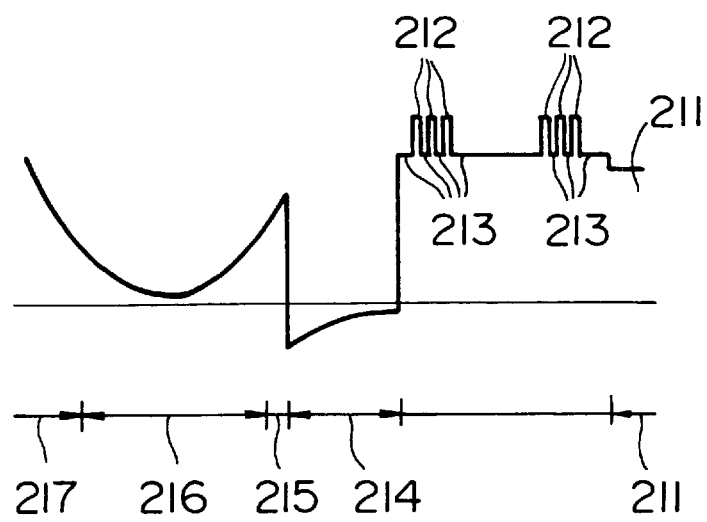
FIG. 3B is an energy band diagram indicating a change in conduction band of the second embodiment.

FIGS. 3A and 3B show the second embodiment of the present invention.

FIG. 3A is a sectional view showing the structure of the second embodiment of the present invention, and FIG. 3B is an energy band diagram indicating a change in conduction band of the structure shown in FIG. 3A.

A field effect transistor shown in FIG. 3A is fabricated by forming, on an InP substrate 211, $Al_{0.48}In_{0.52}As$ layers 213 (e.g., with a film thickness of 200 nm), including GaInP layers 212 (e.g., with a GaP composition ratio of 0.4 and a film thickness of 2 nm) at regions separated from the InP substrate 211 by, e.g., 10 nm, 20 nm, 30 nm, 160 nm, 170 nm, and 180 nm, then forming a GaInAs active layer 214 (e.g., with a GaAs composition ratio of 0.47 and a film thickness of 45 nm), an AlInAs spacer layer 215 (e.g., with an AlAs composition ratio of 0.48 and a film thickness of 4 nm), an AlInAs carrier supply layer 216 (e.g., with an AlAs composition ratio of 0.48 and a film thickness of 15 nm), and an AlInAs Schottky layer 217 (e.g., with an AlAs composition ratio of 0.48 and a film thickness of 15 nm) on the resultant structure, and arranging ohmic electrodes (a source electrode 218 and a drain electrode 219) and a Schottky electrode (a gate electrode 220) on the AlInAs Schottky layer 217.

Note that Si of, e.g., $3 \times 10^{18}$ cm$^{-3}$ is doped in the AlInAs carrier supply layer 216. In this manner, when the $Al_{0.48}In_{0.52}As$ layers 213 are used as the buffer layer, and the GaInP layers 212 with the GaP composition ratio of 0.4, which are made of a material different from that of the $Al_{0.48}In_{0.52}As$ layers 213 and which have a larger band gap than that of the InP $Al_{0.48}In_{0.52}As$ layers 213 and a lattice constant different from that of the $Al_{0.48}In_{0.52}As$ layers 213, thus serving as a distortion layer, are interposed in the $Al_{0.48}In_{0.52}As$ layers 213, propagation of dislocations present in the InP substrate 211 to the active layer 214 can be suppressed, the buffer layer thickness can be made as small as 200 nm, and an electron conduction path is not formed in the buffer layer, thereby obtaining a transistor having good pinch-off characteristics.

In the second embodiment, as the buffer layer, one consisting of the $Al_{0.48}In_{0.52}As$ layers 213 and the GaInP layers 212 interposed in the $Al_{0.48}In_{0.52}As$ layers 213 and having a GaP composition ratio of 0.4 is used. However, the GaP composition ratio of the GaInP layers 212 can be changed within the range of 0.1 to 1. As the GaP composition ratio is increased from 0.1, the film thickness (critical thickness) with which the GaInP layers 212 can be formed with a good crystallinity is decreased. Hence, the GaP composition ratio is preferably 0.2 or more and 0.5 or less.

Furthermore, the GaInP layers 212 interposed in the $Al_{0.48}In_{0.52}As$ layers 213 and having a GaP composition ratio of 0.4 can be replaced by either $Al_xIn_{1-x}As$ ($0.5 \leq x \leq 1$) layers, $Al_xGa_{1-x}As$ ($0 \leq x \leq 1$) layers, or $Al_xIn_{1-x}P$ ($0.1 \leq x \leq 1$) layers, or can be replaced by two or more types of layers selected from $Al_xIn_{1-x}P$ ($0.1 \leq x \leq 1$) layers, $Al_xIn_{1-x}As$ ($0.5 \leq x \leq 1$) layers, $Al_xGa_{1-x}As$ ($0 \leq x \leq 1$) layers, and $Ga_xIn_{1-x}P$ ($0.1 \leq x \leq 1$) layers.

In the second embodiment, the $Al_{0.48}In_{0.52}As$ layers 213 and the GaInP layers 212 having a GaP composition ratio of 0.4, both constituting the buffer layer, have film thicknesses of 200 nm and 2 nm, respectively. However, it suffices if, in particular, the GaInP layers having a GaP composition ratio of 0.4 and serving as the distortion layer has a film thickness equal to the critical thickness or less. If the film thickness of the entire buffer layer exceeds 400 nm, electrons are accumulated in the buffer layer to likely form a conduction path; if less than 50 nm, propagation of dislocations present in the InP substrate 211 to the active layer and diffusion of an impurity, e.g., Fe, in the InP substrate 211 may not be eliminated completely. Hence, the total thickness of the buffer layer is preferably within the range of 50 nm to 400 nm.

In the second embodiment, to form the buffer layer, the GaInP layers 212 are inserted in the $Al_{0.48}In_{0.52}As$ layers 213 three in each of the InP substrate 211 side and the active layer 214 side. However, it suffices if at least one GaInP layer 212 is inserted in either the InP substrate 211 side or the active layer 214 side. Furthermore, although the active layer 214 is formed of a GaInAs layer and its GaAs composition ratio is set to 0.47, the GaAs composition ratio can be changed from 0 to 1.

The material to form the active layer 214 may be InP, GaInAs, GaInAsP, InSb, or InGaSb. Regarding the AlAs composition ratio of each of the AlInAs spacer layer 215, the AlInAs carrier supply layer 216, and the AlInAs Schottky layer (217), it can be changed from 0.48 to 1.

The doping concentration can be a desired value. Regarding the dopant, in the second embodiment, as the electrons are employed as the carrier, Si is used as an n-type dopant. However, any other dopant, e.g., S or Se, can be used as far as it serves as an n-type dopant. In a heterojunction field effect transistor that uses holes as the carrier, a p-type dopant, e.g., Be or C, can be used.

Figure 4A:
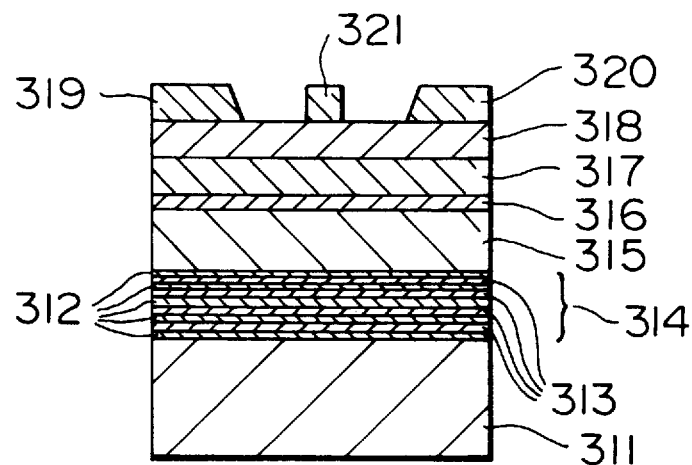
FIG. 4A is a sectional view showing the structure of the third embodiment of the present invention.
Figure 4B:
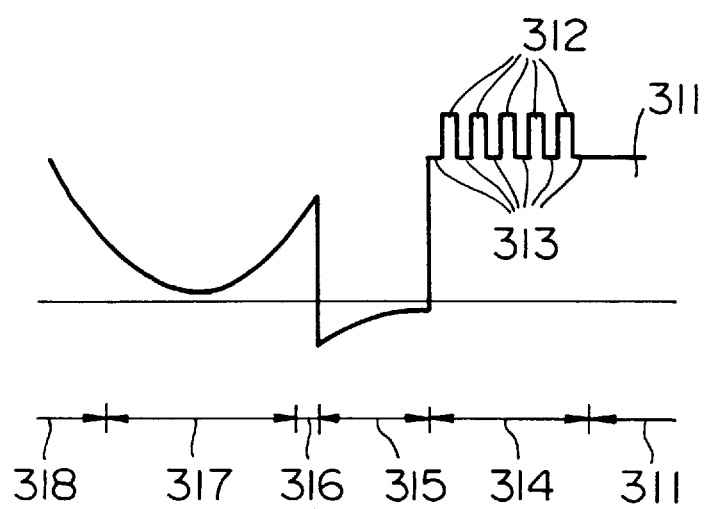
FIG. 4B is an energy band diagram indicating a change in conduction band of the third embodiment.

FIGS. 4A and 4B show the third embodiment of the present invention.

FIG. 4A is a sectional view showing the structure of the third embodiment of the present invention, and FIG. 4B is an energy band diagram indicating a change in conduction band of the structure shown in FIG. 4A.

A field effect transistor shown in FIG. 4A is fabricated by forming, on an InP substrate 311, a superlattice 314 (e.g., 15 cycles) consisting of InP layers 313 (e.g., with a film thickness of 8 nm) and AlGaAs layers 312 (e.g., with an AlAs composition ratio of 0.3 and a film thickness of 2 nm), a GaInAs active layer 315 (e.g., with a GaAs composition ratio of 0.47 and a film thickness of 45 nm), an AlmnAs spacer layer 316 (e.g., with an AlAs composition ratio of 0.48 and a film thickness of 4 nm), an AlInAs carrier supply layer 317 (e.g., with an AlAs composition ratio of 0.48 and a film thickness of 15 nm), and an AlInAs Schottky layer 318 (e.g., with an AlAs composition ratio of 0.48 and a film thickness of 15 nm), and arranging ohmic electrodes (a source electrode 319 and a drain electrode 320) and a Schottky electrode (a gate electrode 321) on the AlInAs Schottky layer 318.

Note that Si of, e.g., $3 \times 10^{18}$ cm$^{-3}$ is doped in the AlIAs carrier supply layer 317. In this manner, when the superlattice 314, consisting of the InP layers 313 and the AlInP layers 312 with the AlP composition ratio of 0.3, which are made of a material different from that of the InP layers 313 and which have a larger band gap than that of the InP layers 313 and a lattice constant different from that of the InP layers 313, thus serving as the distortion layer, is used as the buffer layer, propagation of dislocations present in the InP substrate 311 to the GamnAs active layer 315 can be suppressed, the buffer layer thickness can be made as small as 150 nm, and an electron conduction path is not formed in the buffer layer, thereby obtaining a transistor having good pinch-off characteristics.

In the third embodiment, as the buffer layer, the superlattice 314 consisting of the InP layers 313 and the AlGaAs layers 312 having an AlAs composition ratio of 0.3 is used. However, the AlAs composition ratio of the AlGaAs layers 312 can be changed within the range of 0.1 to 1.

Furthermore, the AlGaAs layers 312 having an AlAs composition ratio of 0.3 can be replaced by either $Al_xIn_{1-x}As$ ($0.5 \leq x \leq 1$) layers, $Ga_xIn_{1-x}P$ ($0.1 \leq x \leq 1$) layers, or $Al_xIn_{1-x}P$ ($0.1 \leq x \leq 1$) layers, or can be replaced by two or more types of layers selected from $Al_xIn_{1-x}P$ ($0.1 \leq x \leq 1$) layers, $Al_xIn_{1-x}As$ ($0.5 \leq x \leq 1$) layers, $Al_xGa_{1-x}As$ ($0 \leq x \leq 1$) layers, and $Ga_xIn_{1-x}P$ ($0.1 \leq x \leq 1$) layers.

In the third embodiment, the InP layers 313 and the AlGaAs layers 312 having an AlAs composition ratio of 0.3, both constituting the superlattice, have film thicknesses of 8 nm and 2 nm, respectively. However, it suffices if, in particular, the AlGaAs layers 312 having an AlAs composition ratio of 0.3 and serving as the distortion layer has a film thickness equal to the critical thickness or less. If the film thickness of the entire buffer layer exceeds 400 nm, electrons are accumulated in the buffer layer to likely form a conduction path; if less than 50 nm, propagation of dislocations present in the InP substrate to the active layer and diffusion of an impurity, e.g., Fe, in the InP substrate 311 may not be eliminated completely. Hence, the total thickness of the buffer layer is preferably within the range of 50 nm to 400 nm. Furthermore, although the active layer 315 is formed of a GaInAs layer and its GaAs composition ratio is set to 0.47, the GaAs composition ratio can be changed from 0 to 1.

The material to form the active layer 315 may be InP, GaInAs, GaInAsP, InSb, or InGaSb. Regarding the AlAs composition ratio of each of the AlInAs spacer layer 316, the AlInAs carrier supply layer 317, and the AlInAs Schottky layer 318, it can be changed from 0.48 to 1.

The doping concentration can be a desired value. Regarding the dopant, in the third embodiment, as the electrons are employed as the carrier, Si is used as an n-type dopant. However, any other dopant, e.g., S or Se, can be used as far as it serves as an n-type dopant.

In a heterojunction field effect transistor that uses holes as the carrier, a p-type dopant, e.g., Be or C, can be used.

Figure 5A:
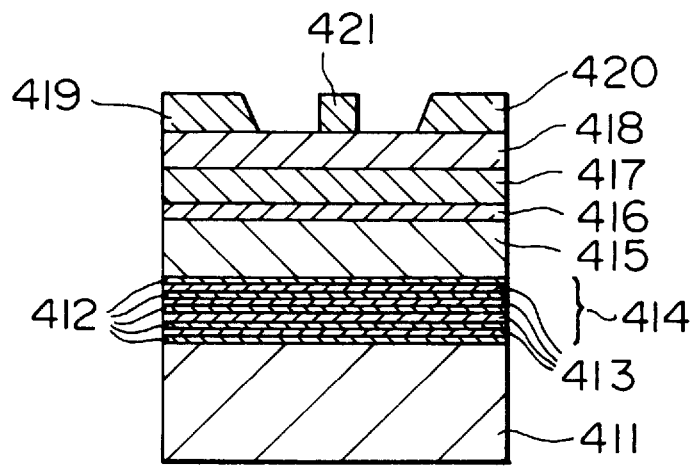
FIG. 5A is a sectional view showing the structure of the fourth embodiment of the present invention.
Figure 5B:
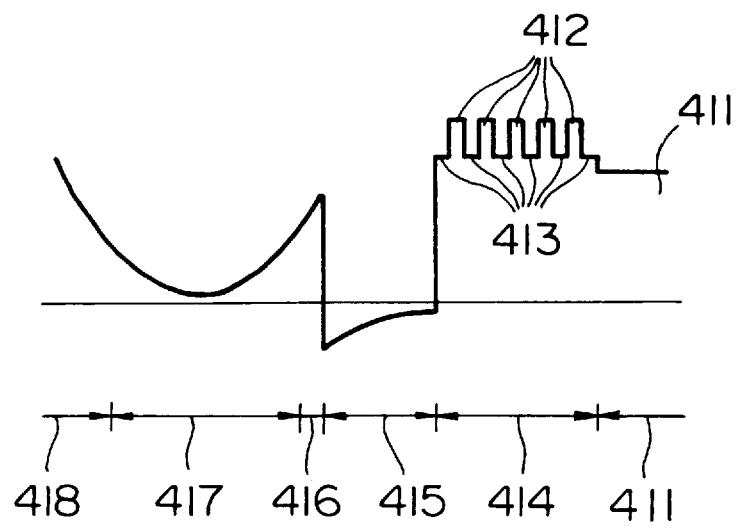
FIG. 5B is an energy band diagram indicating a change in conduction band of the fourth embodiment.

FIGS. 5A and 5B show the fourth embodiment of the present invention.

FIG. 5A is a sectional view showing the structure of the fourth embodiment of the present invention, and FIG. 5B is an energy band diagram indicating a change in conduction band of the structure shown in FIG. 5A.

A field effect transistor shown in FIG. 5A is fabricated by forming, on an InP substrate 411, a superlattice (414) (e.g., 20 cycles) consisting of $In_{0.52}Al_{0.48}As$ layers 413 (e.g., with a film thickness of 4 nm) and AlInAs layers 412 (e.g., with an AlAs composition ratio of 0.7 and a film thickness of 2 nm), a GaInAs active layer 415 (e.g., with a GaAs composition ratio of 0.47 and a film thickness of 45 nm), an AlInAs spacer layer 416 (e.g., with an AlAs composition ratio of 0.48 and a film thickness of 4 nm), an AlInAs carrier supply layer 417 (e.g., with an AlAs composition ratio of 0.48 and a film thickness of 15 nm), and an AlInAs Schottky layer 418 (e.g., with an AlAs composition ratio of 0.48 and a film thickness of 15 nm), and arranging ohmic electrodes (a source electrode 419 and a drain electrode 420) and a Schottky electrode (a gate electrode 421) on the AlInAs Schottky layer 418.

Note that Si of, e.g., $3 \times 10^{18}$ cm$^{-3}$ is doped in the AlInAs carrier supply layer 517. In this manner, when the superlattice consisting of the $In_{0.52}Al_{0.48}As$ layers 413 and the AlInAs layers 412 having a larger band gap than that of the $In_{0.52}Al_{0.48}As$ layers 413 and a lattice constant different from that of the $In_{0.52}Al_{0.48}As$ layers 413, thus serving as the distortion layer, is used as the buffer layer, propagation of dislocations present in the InP substrate 411 to the active layer 415 can be suppressed, the buffer layer thickness can be made as small as 120 nm, and an electron conduction path is not formed in the buffer layer, thereby obtaining a transistor having good pinch-off characteristics.

In the fourth embodiment, as the buffer layer, the superlattice consisting of the $In_{0.52}Al_{0.48}As$ layers 413 and the AlInAs layers 412 having an AlAs composition ratio of 0.7 is used. However, the AlAs composition ratio of the AlInAs layers 412 can be changed within the range of 0.5 to 1. As the AlAs composition ratio is increased from 0.5, the film thickness (critical thickness) with which the AlInAs layers 412 can be formed with a good crystallinity is decreased. Hence, the AlAs composition ratio is preferably 0.55 or more and 0.8 or less. Furthermore, the AlInAs layers 412 having an AlAs composition ratio of 0.7 can be replaced by either $Al_xGa_{1-x}As$ ($0 \leq x \leq 1$) layers, $Ga_xIn_{1-x}P$ ($0.1 \leq x \leq 1$) layers, or $Al_xIn_{1-x}P$ ($0.1 \leq x \leq 1$) layers, or can be replaced by two or more types of layers selected from $Al_xIn_{1-x}P$ ($0.1 \leq x \leq 1$) layers, $Al_xIn_{1-x}As$ ($0.5 \leq x \leq 1$) layers, $Al_xGa_{1-x}As$ ($0 \leq x \leq 1$) layers, and $Ga_xIn_{1-x}P$ ($0.1 \leq x \leq 1$) layers.

In the fourth embodiment, the $In_{0.52}Al_{0.48}As$ layers 413 and the AlInAs layers 412 having an AlAs composition ratio of 0.7, both constituting the superlattice, have film thicknesses of 4 nm and 2 nm, respectively. However, it suffices if, in particular, the AlInAs layers 412 having an AlAs composition ratio of 0.7 and serving as the distortion layer has a film thickness equal to the critical thickness or less. If the film thickness of the entire buffer layer exceeds 400 nm, electrons are accumulated in the buffer layer to likely form a conduction path; if less than 50 nm, propagation of dislocations present in the InP substrate 411 to the active layer and diffusion of an impurity, e.g., Fe, in the InP substrate may not be eliminated completely. Hence, the total thickness of the buffer layer is preferably within the range of 50 nm to 400 nm.

Furthermore, although the active layer 415 is formed of a GaInAs layer and its GaAs composition ratio is set to 0.47, the GaAs composition ratio can be changed from 0 to 1. The material to form the active layer 415 may be InP, GaInAs, GaInAsP, InSb, or InGaSb. Regarding the AlAs composition ratio of each of the AlInAs spacer layer 416, the AlInAs carrier supply layer 417, and the AlInAs Schottky layer 418, it can be changed from 0.48 to 1. The doping concentration can be a desired value.

Regarding the dopant, in the fourth embodiment, as the electrons are employed as the carrier, Si is used as an n-type dopant. However, any other dopant, e.g., S or Se, can be used as far as it serves as an n-type dopant. In a heterojunction field effect transistor that uses holes as the carrier, a p-type dopant, e.g., Be or C, can be used.

The fifth embodiment of the present invention will be described with reference to FIGS. 6A and 6B.

Figure 6A:
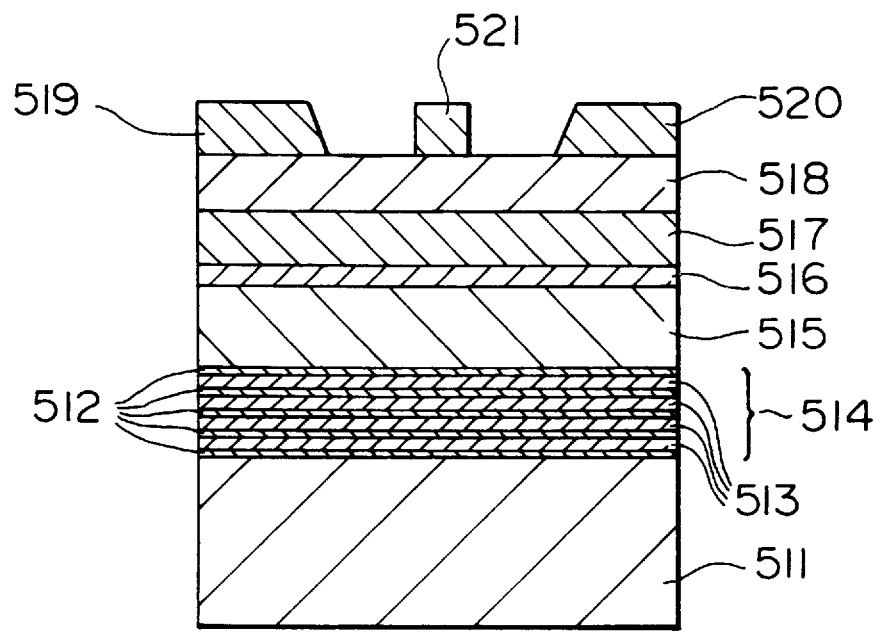
FIG. 6A is a sectional view showing the structure of the fifth embodiment of the present invention.
Figure 6B:
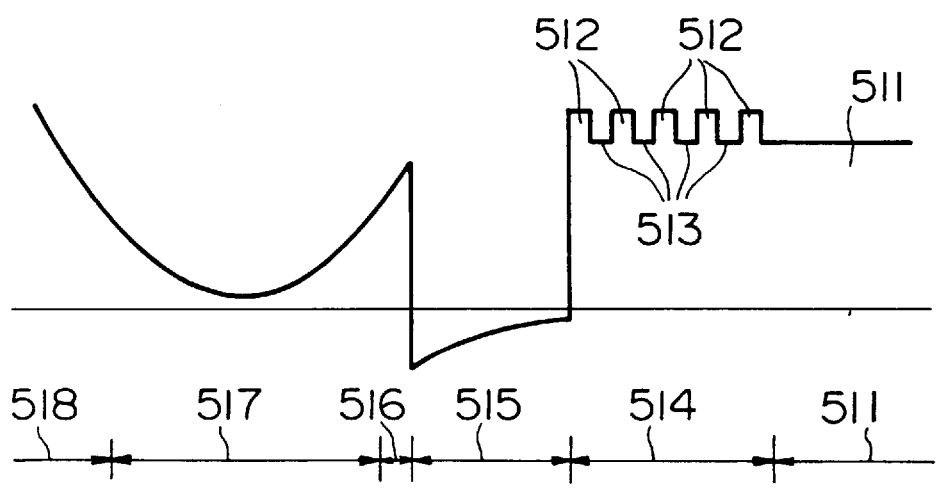
FIG. 6B is an energy band diagram indicating a change in conduction band of the fifth embodiment.

FIG. 6A is a sectional view showing the structure of the fifth embodiment of the present invention, and FIG. 6B is an energy band diagram indicating a change in conduction band of the structure shown in FIG. 6A.

A field effect transistor shown in FIG. 6A is fabricated by forming, on an InP substrate 511, a superlattice 514 (e.g., 20 cycles) consisting of $In_{0.52}Al_{0.48}As$ layers 512 (e.g., with a film thickness of 5 nm) and InP layers 513 (e.g., with a film thickness of 5 nm), a GaInAs active layer 515 (e.g., with a GaAs composition ratio of 0.47 and a film thickness of 45 nm), an AlInAs spacer layer 516 (e.g., with an AlAs composition ratio of 0.48 and a film thickness of 4 nm), an AlInAs carrier supply layer 517 (e.g., with an AlAs composition ratio of 0.48 and a film thickness of 15 nm), and an AlInAs Schottky layer 518 (e.g., with an AlAs composition ratio of 0.48 and a film thickness of 15 nm) sequentially, and arranging ohmic electrodes (a source electrode 519 and a drain electrode 520) and a Schottky electrode (a gate electrode 521) on the AlInAs Schottky layer 518. Note that Si of, e.g., $3 \times 10^{18}$ cm$^{-3}$ is doped in the AlInAs carrier supply layer 517.

In this manner, when the superlattice consisting of the $In_{0.52}Al_{0.48}As$ layers 512 and the InP layers 513 made of a material different from that of the $In_{0.52}Al_{0.48}As$ layers 512 is used as the buffer layer, propagation of dislocations present in the InP substrate 511 to the active layer can be suppressed, the buffer layer thickness can be made as small as 200 nm, and an electron conduction path is not formed in the buffer layer, thereby obtaining a transistor having good pinch-off characteristics.

In the fifth embodiment, each of the $In_{0.52}Al_{0.48}As$ layers 512 and the InP layers 513 both consisting of the superlattice has a film thickness of 5 nm. However, the layers constituting the superlattice can have desired thicknesses. Note that if the film thickness of the entire buffer layer exceeds 400 nm, electrons are accumulated in the buffer layer to likely form a conduction path; if less than 50 nm, propagation of dislocations present in the InP substrate 511 to the active layer and diffusion of an impurity, e.g., Fe, in the InP substrate 511 may not be eliminated completely. Hence, the total thickness of the buffer layer is preferably within the range of 50 nm to 400 nm.

Furthermore, although the active layer 515 is formed of a GaInAs layer and its GaAs composition ratio is set to 0.47, the material to form the active layer 515 may be replaced by InP, GaInAsP, InSb, or InGaSb, and the GaAs composition ratio can be changed from 0 to 1.

Regarding the AlAs composition ratio of each of the AlInAs carrier supply layer 517 and the AlInAs Schottky layer 518, it can be changed from 0.48 to 1.

The doping concentration can be a desired value.

Regarding the dopant, in the fifth embodiment, as the electrons are employed as the carrier, Si is used as an n-type dopant. However, any other dopant, e.g., S or Se, can be used as far as it serves as an n-type dopant. In a heterojunction field effect transistor that uses holes as the carrier, a p-type dopant, e.g., Be or C, can be used.

What is claimed is:

1. A heterojunction field effect transistor having an InP substrate, comprising a buffer layer formed between an active layer where a carrier travels and said InP substrate, wherein said buffer layer comprises at least two cycles of superlattices, each of said superlattices being formed of at least one semiconductor selected from the group consisting of $Al_xIn_{1-x}P$ ($0.1 \leq x \leq 1$), $Ga_xIn_{1-x}P$ ($0 \leq x \leq 1$), $Al_xGa_{1-x}As$ ($0 \leq x \leq 1$) and $Al_xIn_{1-x}As$ ($0.5 \leq x \leq 1$), and at least one semiconductor selected from the group consisting of InP and $In_{0.52}Al_{0.48}As$.

2. A heterojunction field effect transistor having an InP substrate, comprising a buffer layer formed between an active layer where a carrier travels and said InP substrate, wherein said buffer layer comprises an $In_{0.52}Al_{0.48}As$ layer and at least one layer selected from the group consisting of an $Al_xIn_{1-x}P$ ($0.1 \leq x \leq 1$) layer, a $Ga_xIn_{1-x}P$ ($0 \leq x \leq 1$) layer, an $Al_xGa_{1-x}As$ ($0 \leq x \leq 1$) layer and an $Al_xIn_{1-x}As$ ($0.5 \leq x \leq 1$) layer.

3. A transistor according to claim 1, wherein an AlP composition ratio of said AlInP layer preferably falls within a range of 0.2 to 0.5 molar fraction.

4. A transistor according to claim 2, wherein an AlP composition ratio of said AlInP layer preferably falls within a range of 0.2 to 0.5 molar fraction.

5. A transistor according to claim 1, wherein a GaP composition ratio of said GaInP layer preferably falls within a range of 0.2 to 0.5 molar fraction.

6. A transistor according to claim 2, wherein a GaP composition ratio of said GaInP preferably falls within a range of 0.2 to 0.5 molar fraction.

7. A transistor according to claim 1, wherein an AlAs composition ratio of said AlGaAs layer is preferably 0.3 molar fraction.

8. A heterojunction field effect transistor having an InP substrate, comprising a buffer layer formed between an active layer where a carrier travels and said InP substrate, wherein said buffer layer comprises an InP layer and at least one layer selected from the group consisting of an $Al_xGa_{1-x}As$ ($0 \leq x \leq 1$) layer, and an $Al_xIn_{1-x}As$ ($0.5 \leq x \leq 1$) layer; and wherein an AlAs composition ratio of said AlGaAs layer is preferably 0.3 molecular fraction.

9. A transistor according to claim 2, wherein an AlAs composition ratio of said AlGaAs layer is preferably 0.3 molar fraction.

10. A transistor according to claim 1, wherein an AlAs composition ratio of said AlInAs layer preferably falls within a range of 0.55 to 0.8 molar fraction.

11. A transistor according to claim 2, wherein an AlAs composition ratio of said AlInAs layer preferably falls within a range of 0.55 to 0.8 molar fraction.

12. A transistor according to claim 1, wherein said buffer layer has a total thickness falling within a range of 50 nm to 400 nm.

13. A transistor according to claim 2, wherein said buffer layer has a total thickness falling within a range of 50 nm to 400 nm.

14. A transistor according to claim 1, wherein a material consisting of said active layer is at least one selected from the group consisting of GaInAs, InP, GaInAsP, InSb, InGaSb.

15. A heterojunction field effect transistor having an InP substrate, comprising a buffer layer formed between an active layer where a carrier travels and said InP substrate, wherein said buffer layer comprises an InP layer and at least one layer selected from the group consisting of an $Al_xIn_{1-x}P$ ($0.1 \leq x \leq 1$) layer, a $Ga_xIn_{1-x}P$ ($0 \leq x \leq 1$) layer, an $Al_xGa_{1-x}As$ ($0 \leq x \leq 1$) layer, and an $Al_xIn_{1-x}As$ ($0.5 \leq x \leq 1$) layer; and wherein a material consisting of said active layer is at least one selected from the group consisting of GaInAs, InP, GaInAsP, InSb, InGaSb.

16. A transistor according to claim 2, wherein a material consisting of said active layer is at least one selected from the group consisting of GaInAs, InP, GaInAsP, InSb, InGaSb.

17. A transistor according to claim 14, wherein said material selected comprises GaInAs, and wherein a GaAs composition ratio of said active layer falls within a range of 0 to 1 molar fraction.

18. A transistor according to claim 15, wherein said material selected comprises GaInAs, and wherein a GaAs composition ratio of said active layer falls within a range of 0 to 1 molar fraction.

19. A transistor according to claim 16, wherein said material selected comprises GaInAs, and wherein a GaAs composition ratio of said active layer falls within a range of 0 to 1 molar fraction.

20. A heterojunction field effect transistor obtained by sequentially forming a superlattice consisting of at least two cycles of $In_{0.52}Al_{0.48}As$ layers and InP layers, a GaInAs active layer, an AlInAs spacer layer, an AlInAs carrier supply layer and an AlInAs Schottky layer on an InP substrate, and arranging a source electrode, a drain electrode and a gate electrode on a resultant structure.

21. A transistor according to claim 20, wherein said buffer layer has a total thickness falling within a range of 50 nm to 400 nm.

22. A transistor according to claim 20, wherein a GaAs composition ratio of said active layer preferably falls within a range of 0 to 1 molar fraction.

23. A transistor according to claim 20, wherein each AlAs composition ratio of said spacer layer, carrier supply layer and Schottky layer preferably falls within a range of 0.48 to 1.0 molar fraction.

* * * * *